(12) United States Patent
Stephan

(10) Patent No.: US 6,327,424 B1
(45) Date of Patent: Dec. 4, 2001

(54) METHOD OF AND CIRCUIT FOR OPERATING A MOTOR USING POWER TRANSISTORS

(75) Inventor: Waldemar Stephan, Dortmund (DE)

(73) Assignee: Wilo GmbH, Dortmund (DE)

( * ) Notice: Subject to any disclaimer, the term of this patent is extended or adjusted under 35 U.S.C. 154(b) by 0 days.

(21) Appl. No.: 09/396,110

(22) Filed: Sep. 14, 1999

(30) Foreign Application Priority Data

Sep. 15, 1998 (DE) ................................................ 198 42 141

(51) Int. Cl.[7] ...................................................... H02P 5/06
(52) U.S. Cl. .......................... 388/804; 388/819; 318/254; 318/439; 318/696; 318/599
(58) Field of Search ..................... 388/804, 803, 388/819, 829; 318/121, 129, 245, 439, 254, 696, 599

(56) References Cited

U.S. PATENT DOCUMENTS

| | | | |
|---|---|---|---|
| 3,967,173 | * | 6/1976 | Stich ..................................... 318/227 |
| 4,346,434 | * | 8/1982 | Morinaga ............................. 364/183 |
| 4,489,267 | * | 12/1984 | Saar et al. ............................. 318/811 |
| 4,833,586 | * | 5/1989 | Inaba et al. ............................ 363/41 |
| 5,455,884 | * | 10/1995 | Yang .................................... 388/803 |
| 5,663,618 | * | 9/1997 | Adachi et al. ....................... 318/254 |
| 6,002,226 | * | 12/1999 | Collier-Hallman et al. .......... 318/439 |

FOREIGN PATENT DOCUMENTS

| | | |
|---|---|---|
| 32 31 915 A1 | 3/1984 | (DE) . |
| 40 25 378 A1 | 2/1991 | (DE) . |
| 40 15 854 A | 11/1991 | (DE) . |
| 40 15 854 C2 | 11/1991 | (DE) . |
| 41 36 980 A1 | 5/1993 | (DE) . |
| 41 41 093 A1 | 6/1993 | (DE) . |
| 43 33 813 A1 | 4/1994 | (DE) . |
| 94 13 274 | 12/1994 | (DE) . |
| 0 543 296 A2 | 5/1993 | (EP) . |

* cited by examiner

Primary Examiner—Robert E. Nappi
Assistant Examiner—Edgardo San Martin
(74) Attorney, Agent, or Firm—Herbert Dubno

(57) ABSTRACT

The pulse duration of voltage pulses for the control of a motor winding through power transistors is effected by writing data from a microprocessor or CPU to a module having intermediate register into which that data is written, the module then reading the data and effecting the modulation in a pulse by pulse manner.

15 Claims, 4 Drawing Sheets

METHOD OF AND CIRCUIT FOR OPERATING A MOTOR USING POWER TRANSISTORS

FIELD OF THE INVENTION

The present invention relates to a method of operating an electric motor controlled through power transistors and to a circuit for that purpose. The invention also relates to a function-generating control module for power transistors for this purpose, especially for a circulating pump motor for a heating system. More particularly, the invention relates to a method of modulating the pulse duration, also referred to herein as the pulse width or pulse length, of the voltage pulses used as control pulses for power transistors, generally under the control of a microprocessor and in a system in which the microprocessor can transfer data to an intermediate register and the register contents can be read out by a module which initiates the voltage pulses and based upon the register contents, determines the lengths or durations of those pulses. The invention also relates to a circuit for this purpose.

BACKGROUND OF THE INVENTION

Processes in which modulated pulses are used to control power transistors are referred to frequently as pulse duration or pulse width modulation (PWM) systems and can be used to control alternating current motors. In pulse width modulation, a control unit determines a duration of each of a succession of pulses which are applied as voltage pulses to control power transistors so that behind the power transistors, a correspondingly pulsed supply voltage is developed across the motor winding.

Since the motor winding has substantial inductivity, the high frequency alternating voltage can be smoothed to a more or less direct current. If the inductivity of the windings themselves are insufficient for this purposes, ahead of the motor terminals, a smoothing filter can be provided. The result is a direct current flow through the windings or a direct voltage applied across the winding. This direct current can be varied as to its level by modulation of the pulse width and the motor can be a dc motor.

The modulation of the pulse width can be so effected that in the motor windings an alternating current of comparatively low frequency can flow.

The pulse width modulation is effected utilizing a microprocessor which is connected to a module for generating the control signals for the power transistors (PWM module) by writing the pulse width of the next pulse to be generated as a value in a register. The PWM modules reads this value out and switches the power transistor on for the duration of the read value. If, based upon such PWM values, it is desirable to generate a curve, for example, in alternating voltage curve, the microprocessor must inscribe for each switching time a respective value in the register. As a result, a relatively large processor capacity or computer capacity is required so that the microprocessor can respond rapidly to load limits and the like. As soon as the limit is exceeded and the processor is no longer capable of resetting the register in the correct rhythm, the output of the PWM module and the resulting low frequency alternating current signal contain discontinuities. These can lead to electromagnetic failures or noise and require larger filters or additional filter components at considerable cost.

OBJECTS OF THE INVENTION

It is the principal object of the present invention to provide an improved method of pulse width modulation which can utilize smaller capacity processor or computer units, which can eliminate the need for expensive filters and which can insure optimum pulse sequences at high clocking rates and smooth current curves.

Another object of the invention is to provide an improved electronic circuit system for carrying out the process.

It is also an object of the invention to provide an improved circulating pump system for a hot water heating circulation which uses electronic commutation in a more efficient way than has been heretofore.

SUMMARY OF THE INVENTION

These objects and others which will become apparent hereinafter are attained, in accordance with the invention, in a method for modulating the duration of pulses for controlling power transistors which comprises the steps of:

(a) storing data with respect to sequences in a microprocessor;

(b) writing with the microprocessor data characteristic of a succession of pulses of at least one pulse sequence to an intermediate register;

(c) reading with a module connected to the intermediate register the contents thereof and based upon the data read from the intermediate register and characterizing the one pulse sequence:

(c1) initiating and applying to the power transistors a corresponding succession of transistor-control pulses, (c2) limiting a duration of a first, starting one of the transistor-control pulses to a duration determined by data contents of the register, and (c3) varying the durations of the remaining transistor-control pulses of the succession of transistor-control pulses to ultimately reach a final transistor-control pulse of the succession of transistor-control pulses in accordance with the data in the intermediate register.

A circuit in accordance with the invention can comprise:

a microprocessor for storing data with respect to pulse sequences;

an intermediate register connected to the microprocessor whereby the microprocessor can write data characteristic of a succession of pulses of at least one pulse sequence to the intermediate register; and a module connected to the intermediate register for reading out the contents thereof and based upon data read from the intermediate register and characterizing the one pulse sequence:

initiating and applying to the power transistors a corresponding succession of transistor-control pulses, limiting a duration of a first starting one of the transistor control pulses to a duration determined by data contents of the register, and varying the durations of the remaining transistor-control pulses of the succession of transistor control pulses to ultimately reach a final transistor control pulse of the succession of transistor-control pulses in accordance with the data in the intermediate register.

More specifically, in the method aspects of the invention, for an electrocommuted DC motor utilized as a pump drive for a circulating pump for a heating system, the power to the electric motor is delivered through power transistors, at least one microprocessor is provided, an intermediate register is connected to the microprocessor and the contents of the intermediate register can be read out by a module which determines the lengths or durations of the voltage pulses based upon the register contents and initiates those voltage pulses which are applied to the power transistors to trigger them into conduction. The microprocessor inscribes data characterizing a plurality of pulse sequences into the intermediate register and the module reads the data from the intermediate register. Based upon the data read out, the module initiates a plurality of voltage pulses of variable length, the length or duration of the first or starting pulse and the variation of the lengths of the pulses following the starting pulse and up to and including the last pulse or final pulse are calculated from the data in the intermediate register.

The basic thought of the invention is that the PWM module is an intelligent module which based upon parameters drawn from the register can automatically control the width of the next pulse and therefore the pulse width modulation function. The PWM module can advantageously be a simple hardware component like a clock generator and/or counter so that a high pulse frequency and thus a high quality of modulation can be achieved.

An important advantage of the invention is that the "intelligent" PWM module can relieve the processor and thus eliminate the need for the processor to make specific pulse by pulse decisions as to the width of each succeeding pulse. The capacity of the microprocessor can be significantly reduced which can contribute to a corresponding reduction of the fabrication costs of the control unit. The process of the invention can be generally utilized for any purposes for which pulse width modulation is suitable but it is particularly advantageous when power transistors are to be controlled and the power transistors generate a direct voltage in the windings of an electric motor. This constant voltage, whose level depends upon the modulation of the invention of the pulse lengths or durations, can be converted to a low frequency alternating voltage suitable for operation of the motor.

With the use of the invention for the control of an electric motor, a smoothing of the low frequency alternating current supplied to the motor windings can result so that the flutter at the motor and the electromagnetic perturbations are significantly reduced. Because it is possible to reduce or eliminate filter costs, the overall cost for the motor and its control circuitry can be significantly reduced as well. The invention permits simplified hardware components to be used while insuring the reliability of operations so that efficient motor control can be realized. The invention provides control of the motor for a speed-regulated circulating pump for a heating or cooling system. The pumps of the invention are therefore of high reliability and flexibility while have especially good operating characteristics. According to a feature of the invention, the PWM module and the microprocessor can be provided as separate units for flexibility of installation and mounting or to allow a retrofitting of existing motor units with the PWM module and register of the invention. Alternatively, for simplicity of control and to reduce the overall costs, the microprocessor and PWM module can form a common hardware unit in which the microprocessor simultaneously contains the PWM module.

Preferably the intermediate register serves to store all of the data required for calculating the modulation which may be necessary. This can be accomplished by the configuration of the PWM module so that the latter has its modulation function built in or by providing the data in the PWM module from which the modulation can be calculated. In one advantageous embodiment, the length of the first or starting pulse is inscribed in the register and the pulse count for the pulse sequence to be generated is inscribed with the functional relationship of the pulse width with the pulse count in the simplest case, namely, a linear relationship. The pulse width can thus increase in constant increments $\Delta t$ from pulse to pulse.

It is, however, advantageous not to have the PWM module calculate the entire modulation of the low frequency alternating voltage in one step but rather to subdivide the modulation function into individual segments and to approximate the segments by partial functions generated by the PWM module. In that case, at predetermined points the microprocessor will generate respective new values which can be inscribed in the register. Thus the PWM module in the simplest case has an optional modulation function, for example, a sine function which is approximated by a series of individual straight line partial functions.

It has been found to be especially advantageous to generate a trapezoidal function since the trapezoidal function can be comprised of straight lines and can approximate the sinusoidal or similar function. In the case of a high clock frequency and the high flexibility of the module in generating partial functions, a variety of different functions can be approximated with a high degree of precision without involving CPU or microprocessor computing operations.

It has been found to be advantageous in the process of the invention to inscribe a number of pulses in the register which can be generated between two pulses of different duration and can have a constant duration. The result is a sequence of pulses some of which have a constant length or duration and which have a given time will provide a constant current in the winding of the motor. The terms pulse duration, pulse width and pulse length have been used synonymously here.

BRIEF DESCRIPTION OF THE DRAWING

The above and other objects, features, and advantages will become more readily apparent from the following description, reference being made to the accompanying drawing in which.

SPECIFIC DESCRIPTION

Figure 4:
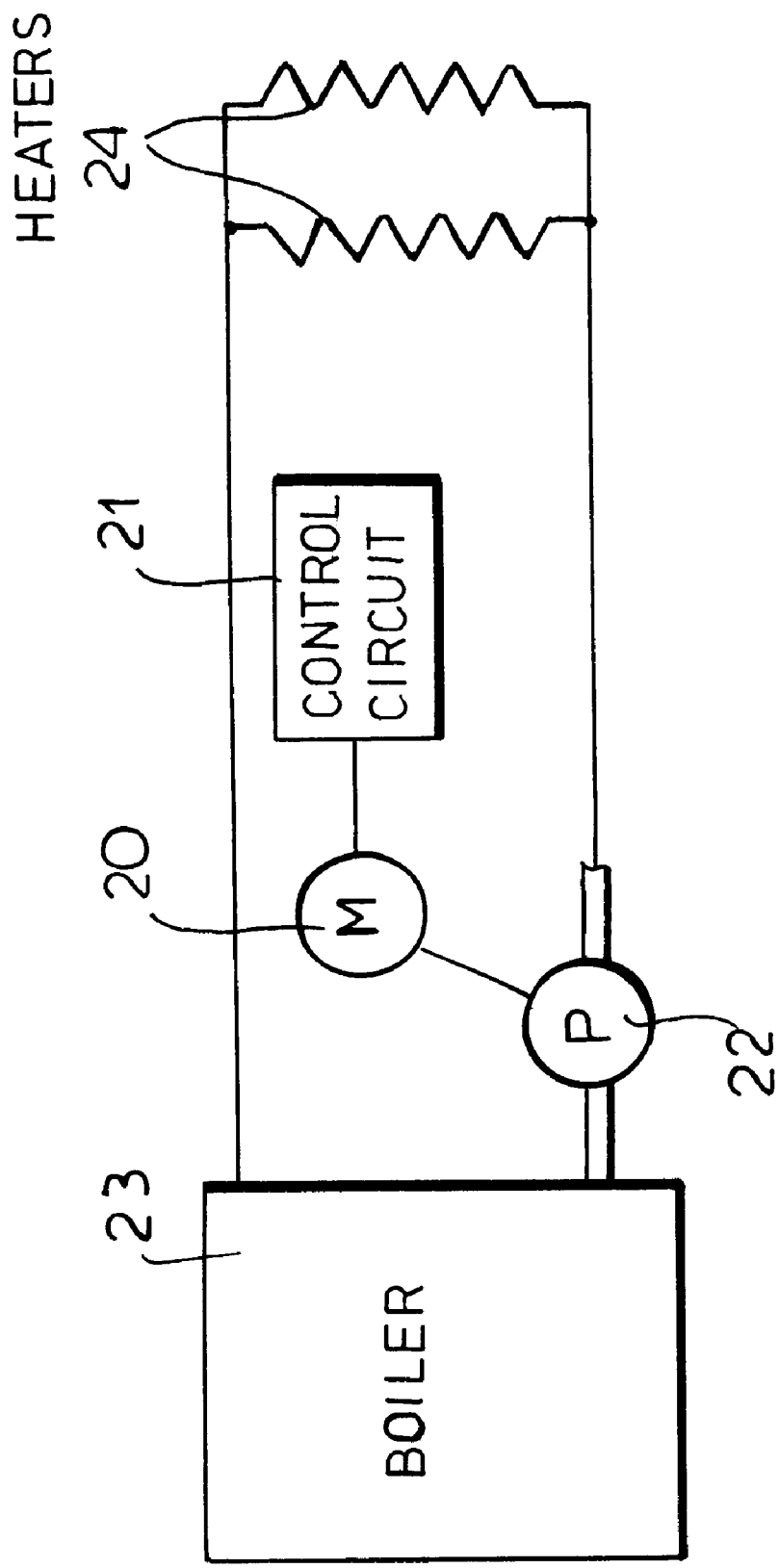
FIG. 4 is a diagram of a heating system equipped with a motor driven pump utilizing the circuit of FIG. 1.

Referring first to FIG. 4, it can be seen that a motor 20 provided with the motor windings 2 (see FIG. 1) and operated by a control circuit 21 (FIG. 4) can be connected to a circulating pump 22 of the centrifugal type to circulate water in a hot water heating or cooling system, here a hot water system in which the hot water from a boiler 23 passes to convectors 24 in a space to be heated and the return is through the pump 22 to the boiler 23.

Figure 1:
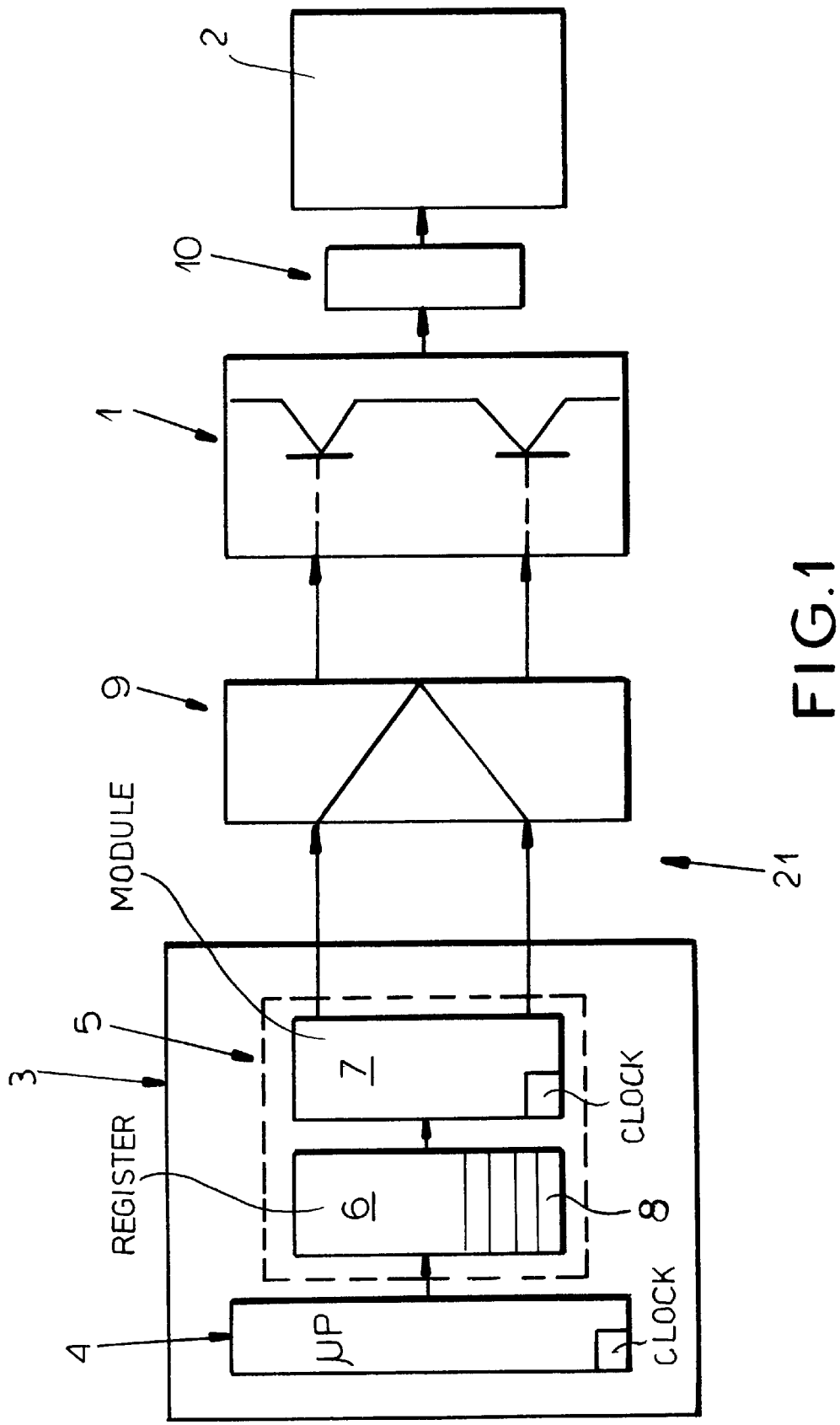
FIG. 1 is a block circuit diagram showing a pulse width modulation system according to the invention.

Such motors can be referred to as electrically commutated motors and can be operated by a circuit of the kind shown in FIG. 1.

The voltage pulses to the winding 2 of the motor are generated by power transistors 1 and the output from the power transistor block to the motor winding two can extend through a smoothing filter 10.

The power transistors 1 are controlled by a computer unit 3 which comprises a microprocessor with a central processor unit 4 (CPU) and a customary clock. The CPU 4 is connected to a module 5 and in the embodiment illustrated, the CPU 4 and the modules may be a single physical unit or chip. The module 5, in turn, has two distinct functional units 6 and 7 which may be provided in the single chip. The control part 6 may be provided with an intermediate register which can receive a multiplicity of values and into which data from the CPU can be written. The intermediate register 8 is simultaneously capable of being read out from the module 5. The other functional component is the modulation module 7 which can have the same clock as the CPU 4 or its own clock as shown.

In spite of the joining of module 5 and CPU 4 in a common circuit, the module 5 is a self standing computer element which is capable of performing simple operations. Thus the module 5 can via the driver 9, set specific durations for which the power transistors 1 are switched on. Such a pulse sequence, generated by the module 5, has been shown in FIG. 2. For generation of the pulse sequence, data is initially transferred from the CPU 4 to the intermediate register 8.

Since the illustrated embodiment is a linear increase in the pulse width with time, the data of the pulse duration $\Delta t_{p1}$ of the first starting pulse P1, the number of the pulses to be generated until the last pulse P3 is reached, here three pulses, and the functional relationship of the lengths or durations of the subsequent pulses P2 and P3 are stored in the register. Since the functional relationship in this example is linear, a linear change function in the function of a duration difference $\Delta t = \Delta t_{Pn} - \Delta t_{Pn-1}$ is read into the register from the CPU.

As soon as the register is inscribed with the data, the module 5 has the possibility of generating the time $t_{p1}$ a starting pulse via the driver 9 and with a duration $\Delta_{p1}$. Independently from the CPU, the modulator component 7 of module 5, which in the simplest case is only a clock with a higher clock frequency, a counter and a summing unit, the duration of the subsequent pulse $\Delta t_{P2}$. The module thus generates the point $t_{P2}$ at which the next pulse P2 is generated.

For generating the final pulse, the module 5 requires only the addition of a further $\Delta t$ to the pulse length or duration of $\Delta t_{P2}$.

Figure 2:
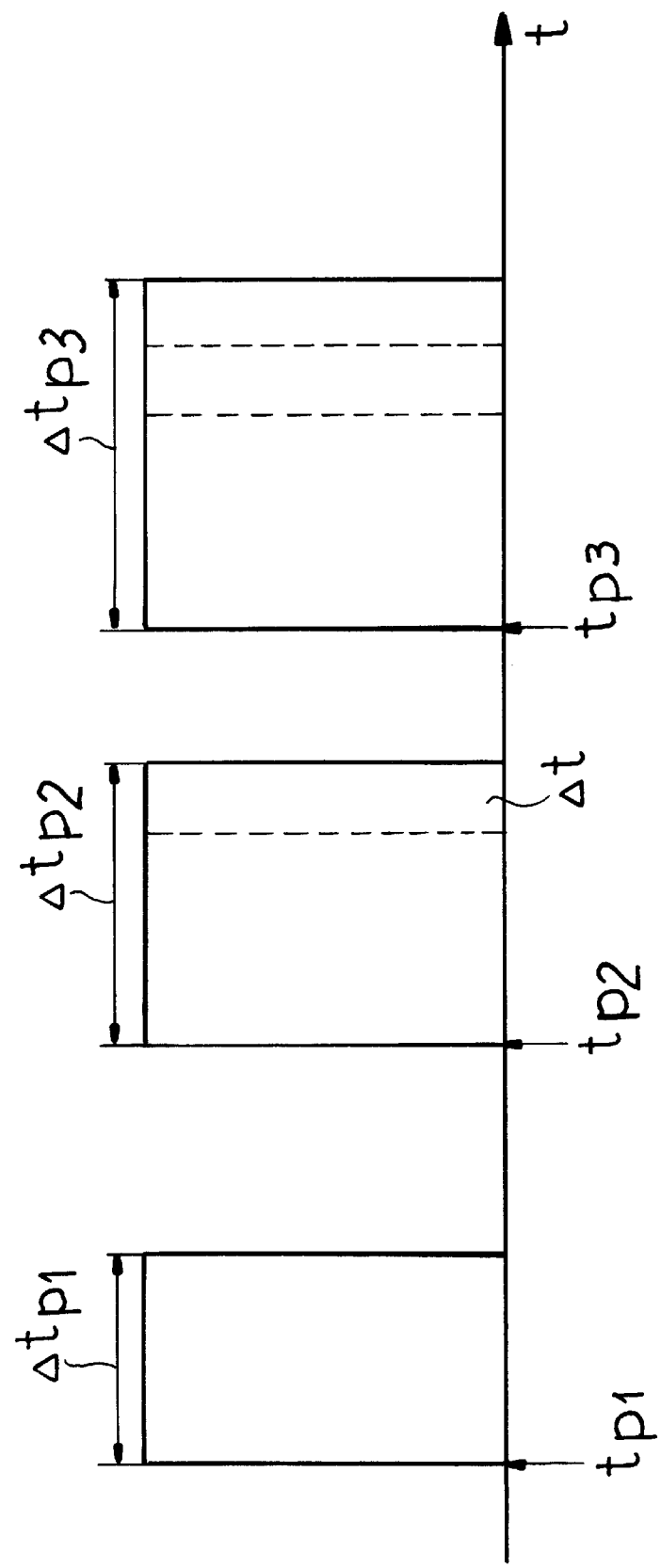
FIG. 2 is a timing diagram showing a pulse sequence with increasing pulse width.

The pulse sequence of FIG. 2 thus generates in a motor winding 2 connected thereto a linearly increasing direct voltage over a certain time period. The function generated with the pulse sequence corresponds to a part of the modulation function for the current in the winding.

Figure 3:
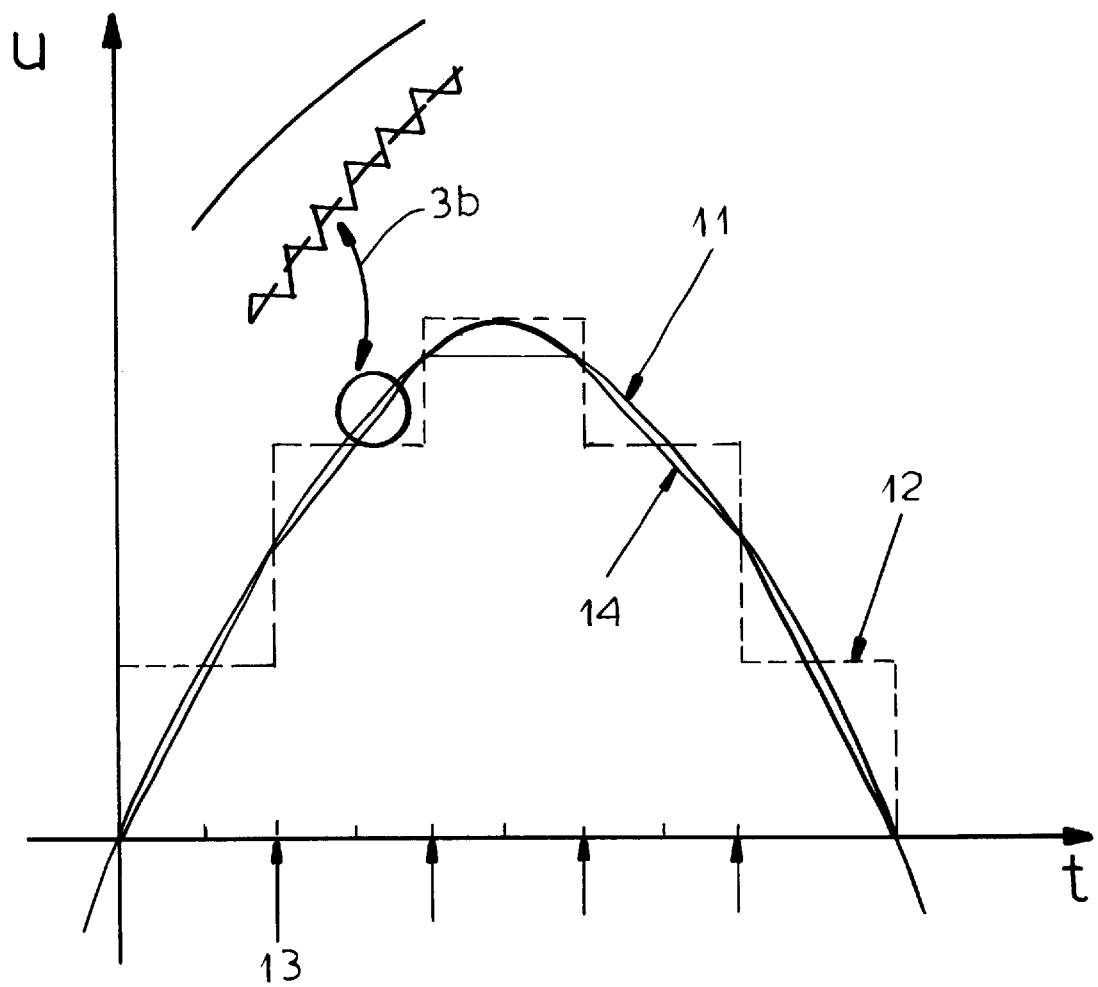
FIG. 3 shows the approximation in the modulation function.

FIG. 3 shows a half wave of an alternating voltage applied to motor and wherein the voltage U is plotted along the ordinate and the time is plotted along the abscissa. The ideal form of the modulation function 11 is approximated by pulse width modulation (broken line 12). One can clearly see the steps which have been triggered by the processor by the specified points (arrows 13) rising from one level to the next. The modulation function is approximated according to the invention by individual linear partial functions 14. The slope of the partial functions change depending upon the processor outputs which write new values from the CPU into the intermediate register. Between two processor actions, the partial function is generated by the module 5. The steps within the partial functions 14 are relatively fine as has been shown in the detail 3b.

I claim:

1. A method of modulating the duration of pulses for control of power transistors applying voltage to a winding of an electronically commutated dc electric motor, said method comprising the steps of:

(a) storing data with respect to sequences in a microprocessor;
   (b) writing with said microprocessor data characteristic of a succession of pulses of at least one pulse sequence to an intermediate register;
   (c) reading with a module separate from said microprocessor and equipped with a clock generator or a counter or with both a clock generator and a counter or a pulse width modulator, and connected to said intermediate register the contents of said intermediate register and based upon the data read from said intermediate register and characterizing said one pulse sequence:
      (c1) initiating and applying to said power transistors a corresponding succession of transistor-control pulses,
      (c2) limiting a duration of a first, starting one of said transistor-control pulses to a duration determined by data contents of said register, and
      (c3) varying the durations of the remaining transistor-control pulses of said succession of transistor-control pulses to ultimately reach a final transistor-control pulse of said succession of transistor-control pulses in accordance with the data in said intermediate register.

2. The method defined in claim 1 wherein the data in said intermediate register includes data representing the duration of said starting one of said transistor-control pulses, the number of the pulse of the succession of transistor control pulses and a functional relationship between the durations of successive pulses of said succession in the form of a duration-change function.

3. The method defined in claim 1 wherein the duration of the starting one of said transistor-control pulses, the duration of said final transistor control pulse and the pulse duration change function are stored in said intermediate register and said module detects the occurrence of the final transistor-control pulse by a comparison of the actual pulse duration and a predetermined duration of the final transistor-control pulse.

4. The method defined in claim 1 wherein said register stores a pulse duration change function for said succession over transistor-control pulses and said function is a linear function describing a duration change AT from one pulse to the next pulse of the corresponding succession.

5. The method defined in claim 1 wherein the number of the pulse of constant length is recorded in said register.

6. The method defined in claim 1 wherein said module is a hardware unit separate from said microprocessor in the form of a counter module, said method further comprising the step of clocking said module independently of said microprocessor.

7. The method defined in claim 1 wherein the microprocessor and said module form a common hardware unit, further comprising the step of clocking said module with a clock of said microprocessor.

8. The method defined in claim 1, further comprising the step of applying a filtered DC form said power transistors to said winding of a voltage controlled by modulation of said pulse durations, said pulses being converted into a low frequency alternating voltage.

9. The method defined in claim 8 wherein the modulation function is controlled by the microprocessor and is subdivided into individual segments, each of said segments being approximated by a respective partial function.

10. The method defined in claim 9 wherein the modulation function is a trapezoidal function having linear segments defined by linear partial functions.

11. The method defined in claim 1, further comprising the step of driving a circulating pump for a heating system with said motor.

12. A circuit for modulating the duration of pulses for control of power transistors applying voltage to a winding of an electrically commutated DC electric motor, said circuit comprising:

a microprocessor for storing data with respect to pulse sequences;

an intermediate register connected to said microprocessor whereby said microprocessor can write data characteristic of a succession of pulses of at least one pulse sequence to said intermediate register; and a module independent of said microprocessor and connected to said intermediate register for reading out the contents thereof and based upon data read from said intermediate register and characterizing said one pulse sequence:

initiating and applying to said power transistors a corresponding succession of transistor-control pulses, limiting a duration of a first starting one of said transistor control pulses to a duration determined by data contents of said register, and varying the durations of the remaining transistor-control pulses of said succession of transistor control pulses to ultimately reach a final transistor control pulse of said succession of transistor-control pulses in accordance with the data in said intermediate register, said module consisting of a clock and a counter or a pulse width modulator.

13. The circuit defined in claim 12 wherein said intermediate register is constructed to receive data having a multiplicity of values and said module is a separate component from said microprocessor with which the varying duration succession of pulses is initiated.

14. The circuit defined in claim 13 wherein the module is constructed to vary the individual lengths of the respective pulses for a given number of pulses based upon automatic calculation from read out register values.

15. The circuit defined in claim 12 wherein said motor drives a circulating pump for a heating system.

* * * * *